US011610765B1

(12) United States Patent
Roche et al.

(10) Patent No.: US 11,610,765 B1
(45) Date of Patent: Mar. 21, 2023

(54) ATMOSPHERIC-PRESSURE PLASMA PROCESSING APPARATUS AND METHOD USING ARGON PLASMA GAS

(71) Applicant: APJeT, Inc., Morrisville, NC (US)

(72) Inventors: Gregory A. Roche, Durham, NC (US); David W. Tyner, Benson, NC (US); Carrie E. Cornelius, Durham, NC (US); Joseph H. Cross, Raleigh, NC (US)

(73) Assignee: APJeT, Inc., Morrisville, NC (US)

( * ) Notice: Subject to any disclaimer, the term of this patent is extended or adjusted under 35 U.S.C. 154(b) by 0 days.

(21) Appl. No.: 16/537,297

(22) Filed: Aug. 9, 2019

Related U.S. Application Data

(60) Provisional application No. 62/716,801, filed on Aug. 9, 2018.

(51) Int. Cl.
| | | |
|---|---|---|
| *H01J 37/32* | (2006.01) | |
| *D06M 13/224* | (2006.01) | |
| *D06M 101/32* | (2006.01) | |
| *D06M 13/236* | (2006.01) | |

(52) U.S. Cl.
CPC .... *H01J 37/32541* (2013.01); *H01J 37/3277* (2013.01); *H01J 37/32348* (2013.01); *H01J 37/32449* (2013.01); *H01J 37/32559* (2013.01); *D06M 13/2246* (2013.01); *D06M 13/236* (2013.01); *D06M 2101/32* (2013.01); *H01J 37/3255* (2013.01); *H01J 2237/002* (2013.01); *H01J 2237/20221* (2013.01); *H01J 2237/334* (2013.01)

(58) Field of Classification Search
CPC .......... H01J 37/32541; H01J 37/32348; H01J 37/32449; H01J 37/32559; H01J 37/3277; H01J 37/3255; H01J 2237/20221; H01J 2237/002; H01J 2237/334; H01J 37/32733; H01J 37/32752; H01J 37/32761; H01J 37/32825; H01J 37/3244; D06M 13/2246; D06M 10/025; D06M 2101/32; D06M 13/326; C23C 16/54; C23C 16/545; H05H 1/2406; H05H 2001/2425; H05H 2001/2412

See application file for complete search history.

(56) References Cited

U.S. PATENT DOCUMENTS

| | | | | |
|---|---|---|---|---|
| 5,895,558 A | * | 4/1999 | Spence | ................... H01J 37/32 204/164 |
| 5,968,377 A | * | 10/1999 | Yuasa | ............... H01J 37/32018 219/121.41 |

(Continued)

*Primary Examiner* — Ram N Kackar
*Assistant Examiner* — Laureen Chan
(74) *Attorney, Agent, or Firm* — Samuel M. Freund; Cochran Freund & Young LLC

(57) ABSTRACT

An atmospheric pressure plasma processing apparatus and method employing argon as a plasma gas in the absence of helium, including nanosecond pulse-powered electrodes having planar surfaces, and grounded electrodes having planar surfaces parallel to the surfaces of the powered electrodes and spaced-apart a chosen distance therefrom, forming plasma regions, are described. The absence of helium from the plasma discharge has been found not to affect the quality of the resulting plasma-polymerized coatings of the processed substrates.

14 Claims, 10 Drawing Sheets

(56) References Cited

U.S. PATENT DOCUMENTS

| | | | | |
|---|---|---|---|---|
| 2002/0134507 | A1* | 9/2002 | DeDontney | C23C 16/45576 156/345.33 |
| 2003/0113479 | A1* | 6/2003 | Fukuda | H01J 37/32825 427/569 |
| 2005/0217798 | A1* | 10/2005 | Sugiyama | H01J 37/32009 156/345.45 |
| 2007/0154650 | A1* | 7/2007 | Wu | H05H 1/2406 427/532 |
| 2008/0156266 | A1* | 7/2008 | Yamamoto | H01J 37/32559 118/723 R |
| 2009/0045168 | A1* | 2/2009 | Hanson | H05H 1/46 156/345.33 |
| 2011/0287193 | A1* | 11/2011 | Creyghton | H01J 37/32348 427/569 |
| 2013/0337657 | A1* | 12/2013 | Savas | H01J 37/32036 438/778 |
| 2014/0076861 | A1* | 3/2014 | Cornelius | H05H 1/46 219/121.52 |
| 2014/0178604 | A1* | 6/2014 | Selwyn | H01J 37/32357 427/562 |
| 2017/0050214 | A1* | 2/2017 | Boscher | H01J 37/32348 |

\* cited by examiner

ATMOSPHERIC-PRESSURE PLASMA PROCESSING APPARATUS AND METHOD USING ARGON PLASMA GAS

BACKGROUND

The use of ionized gases (plasma) for treating, modifying and etching of material surfaces is well established. Both vacuum-based plasmas and those that operate at or near atmospheric pressure, have been used for surface modification of materials ranging from plastic wrap to non-woven materials and textiles, the plasma being used to provide an abundant source of active chemical species, which are formed inside the plasma from the interaction between resident electrons in the plasma and neutral or other gas phase components of the plasma. Included are dielectric barrier discharges (DBDs), which have a dielectric film or cover placed on one or both of the powered and ground electrodes (which may be planar or annular in design).

The use of atmospheric pressure gases for generating a plasma provides a greatly simplified means for treating large or high volume substrates, such as plastics, textiles, non-wovens, carpet, and other large flexible or inflexible objects, such as aircraft wings and fuselages, ships, flooring, and commercial structures. Treatment of these substrates using vacuum-based plasmas would be complicated and prohibitively expensive.

In order to achieve stable, non-arcing plasmas, process gases comprised largely of helium are utilized. Since helium is not a renewable resource and is expensive, recovery operations are necessary. Such operations require significant capital investment, thereby adding substantially to the initial cost for plasma processing apparatus, and to the maintenance thereof.

SUMMARY

In accordance with the purposes of the present invention, as embodied and broadly described herein, embodiments of the atmospheric-pressure plasma apparatus for processing a material hereof includes: at least one grounded electrically conducting electrode having at least one elongated planar surface having a chosen length and width, and a chosen height; at least one powered conducting electrode having at least one elongated planar surface having a chosen length and width, spaced apart a selected distance from and parallel to the at least one grounded electrode; a dielectric flat plate in physical contact with the at least one planar surface of the at least one powered electrode between the at least one powered electrode and the at least one grounded electrode, the dielectric plate having an elongated flat surface facing the at least one elongated planar surface of the at least one ground electrode, at least electrically shielding the at least one elongated planar surface of the at least one powered electrode from the at least one planar surface of the at least one grounded electrode, and forming a volume therebetween; at least one pulsed power supply in electrical communication with the at least one powered electrode, for providing nanosecond high-voltage pulses thereto; a source of plasma gas, wherein the plasma gas comprises argon in the absence of helium; a gas manifold for flowing the plasma gas through the volume; whereby a plasma is formed in the volume, and the material is disposed in the volume.

An embodiment of the method for atmospheric-pressure plasma processing of a material in accordance with the purposes of the present invention, as embodied and broadly described herein, includes: providing at least one grounded electrically conducting electrode having at least one elongated planar surface having a chosen length and width, and a chosen height; at least one powered conducting electrode having at least one elongated planar surface having a chosen length and width, spaced apart a selected distance from and parallel to said at least one grounded electrode; and a dielectric flat plate in physical contact with the at least one planar surface of the at least one powered electrode between the at least one powered electrode and the at least one grounded electrode, the dielectric plate having an elongated flat surface facing the at least one elongated planar surface of the at least one ground electrode, at least electrically shielding the at least one elongated planar surface of the at least one powered electrode from the at least one planar surface of the at least one grounded electrode; forming a volume between the at least one planar surface of the at least one grounded electrode and the planar surface of the dielectric plate, wherein said material is disposed in the volume; flowing a plasma gas comprising argon in the absence of helium through the volume; and providing nanosecond high-voltage pulses using at least one pulsed power supply in electrical communication with said at least one powered electrode; whereby a plasma is formed in the volume.

Benefits and advantages of the present invention include, but are not limited to, providing an the atmospheric-pressure plasma apparatus for processing a material, without requiring helium as a plasma gas constituent.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION OF THE INVENTION

Figure 1A:
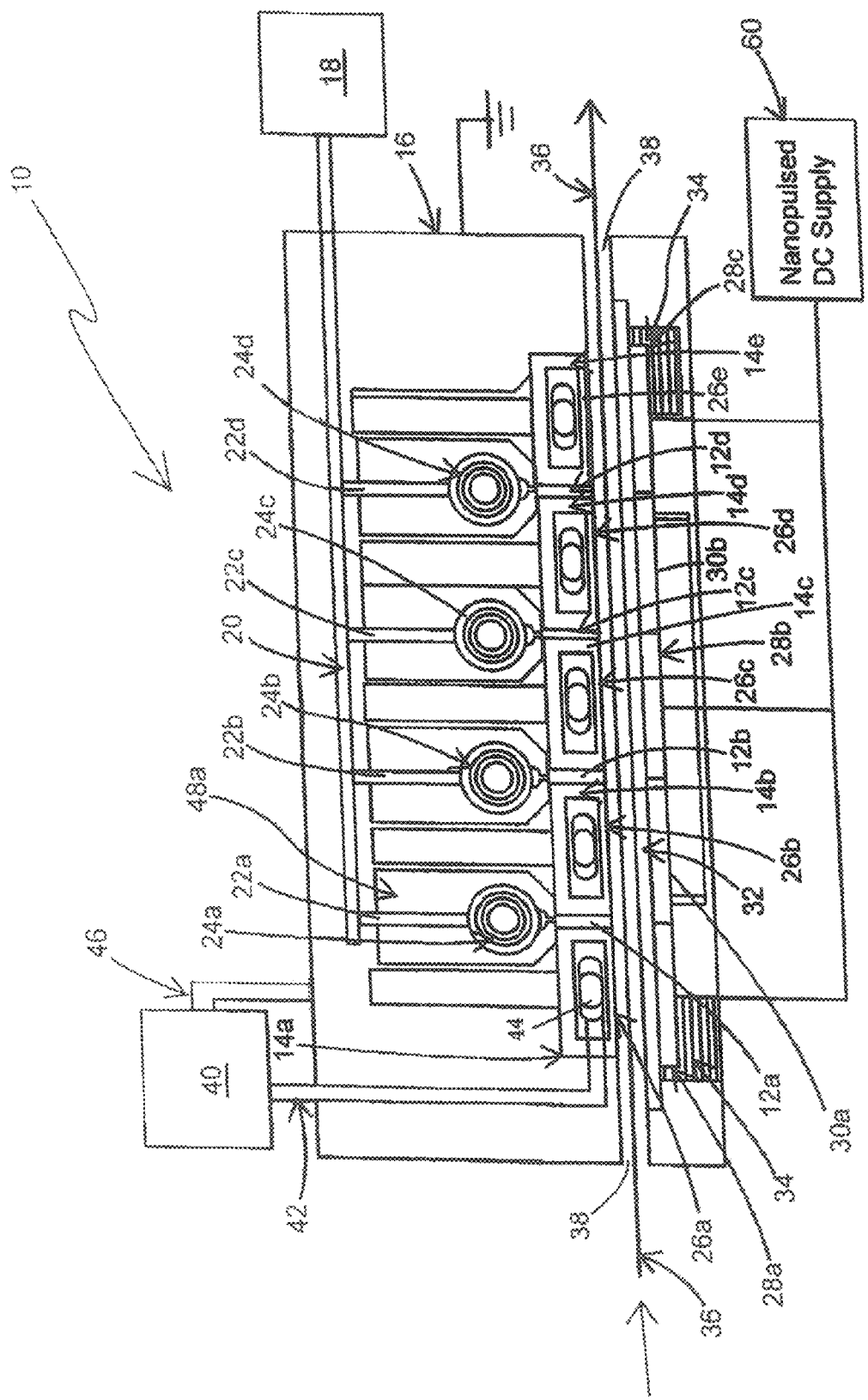
FIG. 1A is a schematic representation of a side view of a generalized embodiment of the apparatus of the present invention, illustrating the embodiment of the plasma gas flow system used in the EXAMPLES below.

Briefly, embodiments of the present plasma processing apparatus include an atmospheric plasma generated in a volume formed by at least one flat grounded electrode and a flat dielectric plate covering at least one powered electrode upon which electrode, nanosecond pulses are impressed. The plasma gas may comprise argon alone, or argon containing small quantities of hydrogen, oxygen, or nitrogen, or mixtures thereof, and may flow into the plasma volume from within the grounded electrode or from between grounded electrodes. Helium is not required to generate or maintain the plasma, although helium may be added to the plasma gas. The material to be processed may be coated with a monomeric material in a separate chamber from the plasma, and is disposed at a chosen distance from the dielectric plate, or in contact therewith and may be moved through the plasma where it is polymerized. The coating apparatus and the plasma processing apparatus are both enclosed in a gas-tight enclosure which is purged with nitrogen gas to keep air out.

Typically, the chosen gas temperature entering the plasma regions may be about 20° C., while the neutral gas temperature exiting the plasma regions may be <70° C. In what follows, the term "atmospheric pressure" means pressures between about 500 Torr and about 1000 Torr. The present plasma source may be used for polymerization (either free radical-induced or through dehydrogenation-based polymerization), surface cleaning and modification, etching, adhesion promotion, and sterilization, as examples.

Reference will now be made in detail to the present embodiments of the invention, examples of which are illustrated in the accompanying drawings. In the Figures, similar structure will be identified using identical reference characters. It will be understood that the FIGURES are presented for the purpose of describing particular embodiments of the invention and are not intended to limit the invention thereto.

A. 10-20 m/min Fabric Speed:

Turning now to FIG. 1A, a schematic representation of a side view of an embodiment, 10, of the plasma apparatus of the present invention is shown, illustrating a plurality of rectangular volumes or regions, 12a-12d, formed between parallel planar side surfaces of elongated (into the FIGURE)

electrodes, 14a-14e, the long dimension thereof being directed into the FIGURE, in electrical connection with grounded support block, 16. In the EXAMPLES, rectangular regions 12a-12d are approximately 2 mm in width. Plasma gas from source, 18, is directed through manifold or plenum, 20, into gas inlet tubes 22a-22d, and then into gas distribution tubes 24a-24d, as will be discussed in more detail below. Planar surfaces, 26a-26e, of electrodes 14a-14e are parallel to elongated powered planar metal electrodes, 28a-28c, the long dimension thereof also being directed into the FIGURE, and separated by spaces, 30a, and, 30b, covered by dielectric plate or fabric support plate, 32, and supported by dielectric support plate, 34. Dielectric support plate 34 may be fabricated from polycarbonate, as an example. Spaces 30a and 30b may comprise air or a solid insulating material such as plastic or glass. In the EXAMPLES, three 1" (2.54 cm) wide by ⅛" (0.32 cm) thick, 18" (45.72 cm) long, solid aluminum electrodes, spaced apart by 1" of air, were employed. Electrodes 14a-14e may be fabricated from hollow, square or rectangular stainless steel, aluminum, copper, or brass tubing, or other metallic conductors, to permit water cooling, as needed. Electrodes 28a-28c may be fabricated from aluminum or other metals. Dielectric plate 32 may comprise glass between about ¹⁄₁₆" (0.16 cm) to about ¼" (0.64 cm) (⅛" (0.32 cm) thick glass was used in the EXAMPLES), plastic, such as PETG (Polyethylene Terephthalate, Glycol-modified), as an example, or ceramic. These latter materials may be utilized with other thicknesses.

Plasma gas from gas source 18 may comprise argon, in the absence of other noble gases, and between about 0.1% and approximately 5% of nitrogen or, more favorably, between about 0.2% and approximately 1.0% nitrogen. In the EXAMPLES, Argon with 0.5% of added nitrogen, was employed. Between about 0.1% and approximately 5% of oxygen or hydrogen may also be added, or mixtures thereof or, more favorably, between about 0.2% and about 1.0% of these gases.

Material to be processed, 36, is disposed in the plasma region, 38, between electrodes 14a-14e and dielectric plate 32, which may be separated between about 1 mm and approximately 50 mm, more advantageously between about 1 mm and about 8 mm; a spacing of 2 mm was employed in the EXAMPLES. Material 36 may rest on dielectric plate 32 in a stationary mode, or may touch dielectric plate 32, as a fabric support plate for fabric or other materials, as material 36 is caused to move through plasma region, 38, but this is not a requirement.

If required, elongated electrodes, 14a-14e may be cooled by fluid cooler, 40, through inlet tube, 42, which passes into an interior channel, 44, of each electrode, exiting through exit tube, 46, at the opposite end thereof, and returning the cooling fluid to cooler 40. In other embodiments, powered electrodes 28a-28c may be cooled by, for example, cooling dielectric support plate 34 (not shown in FIG. 1A). Other methods for cooling the electrodes may be utilized. In the EXAMPLES, the electrodes were not cooled, as the exiting plasma gas was observed to be cool.

Figure 1B:
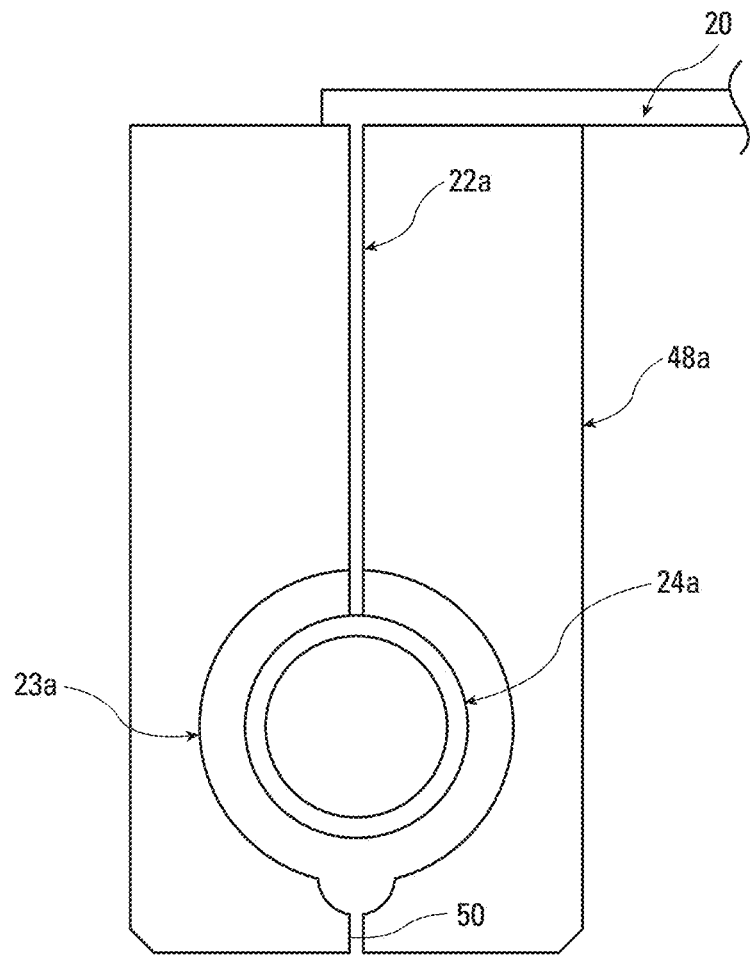
FIG. 1B is a schematic representation of a side view of the gas block illustrated in FIG. 1A, hereof.

FIG. 1B is a schematic representation of a perspective side view of an embodiment of gas injection block 48a of FIG. 1A, hereof, with similar views for the other gas injection blocks, illustrating porous tube, 24a, having a cap at each end, through which flow is established through gas inlet tube, 22a, from gas source 18, the gas uniformly exiting tube 24a along its length into elongated chamber, 23a, before passing through gas exit nozzle 50. Porous tube 24a may include Teflon, ceramic and metal tubes. Commercially available Teflon tubes having porosity between about 10% and approximately 90% for argon have been used in embodiments of the present invention, although 50% porosity has been used advantageously. Selection of tube porosity over this range may be made to provide a desired gas delivery uniformity for a given gas flow/pressure. Lower porosity tubes require higher back pressures, and tend to be more uniform; however, they allow less plasma gas flow, and consequently limit substrate processing speed.

Figure 1C:
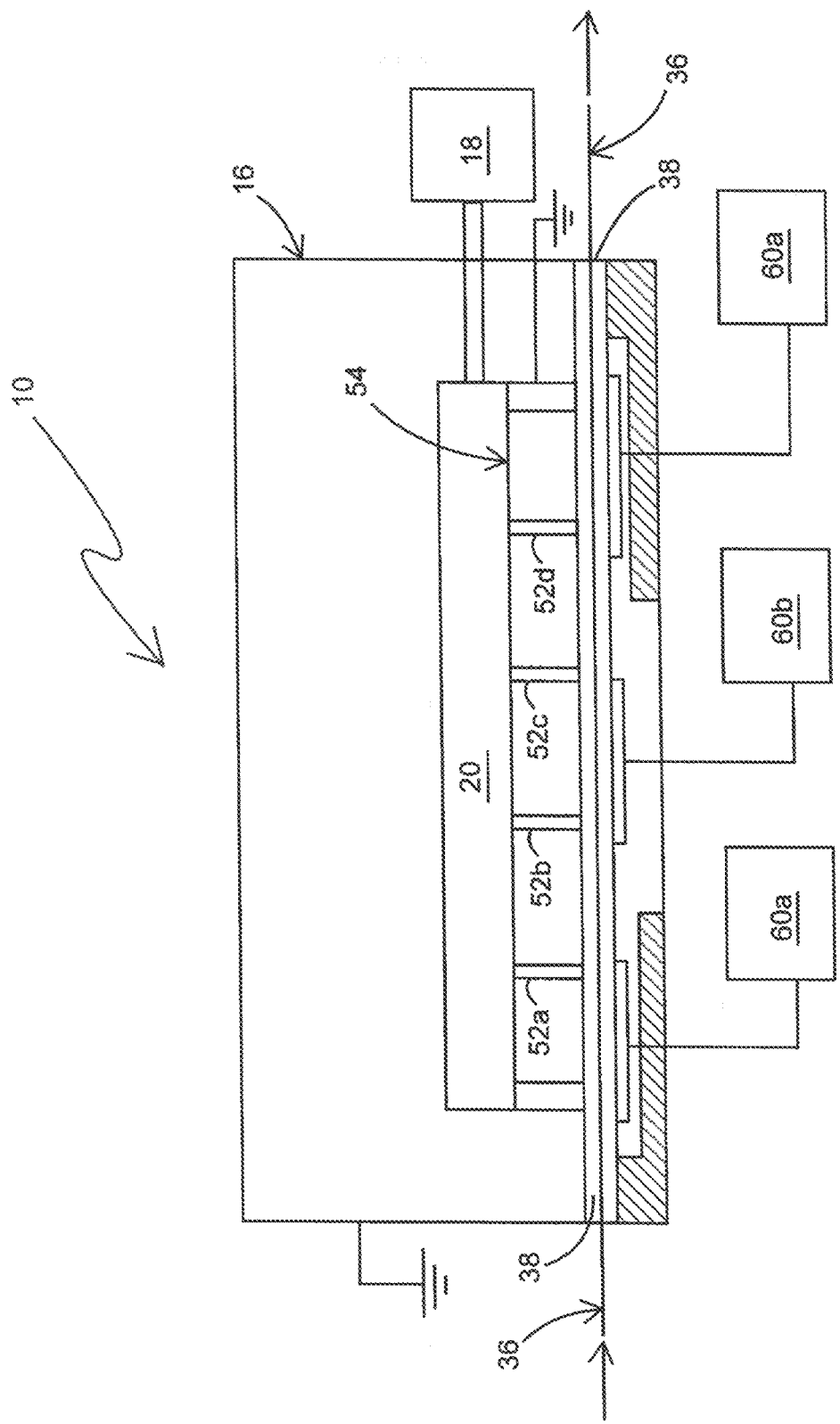
FIG. 1C is a schematic representation of a side view of an embodiment of the plasma gas flow system where plasma gas from a source thereof enters a plenum and flows into the plasma region through narrow elongated (into the page) slots, having chosen widths, formed through a grounded block.
Figure 1D:
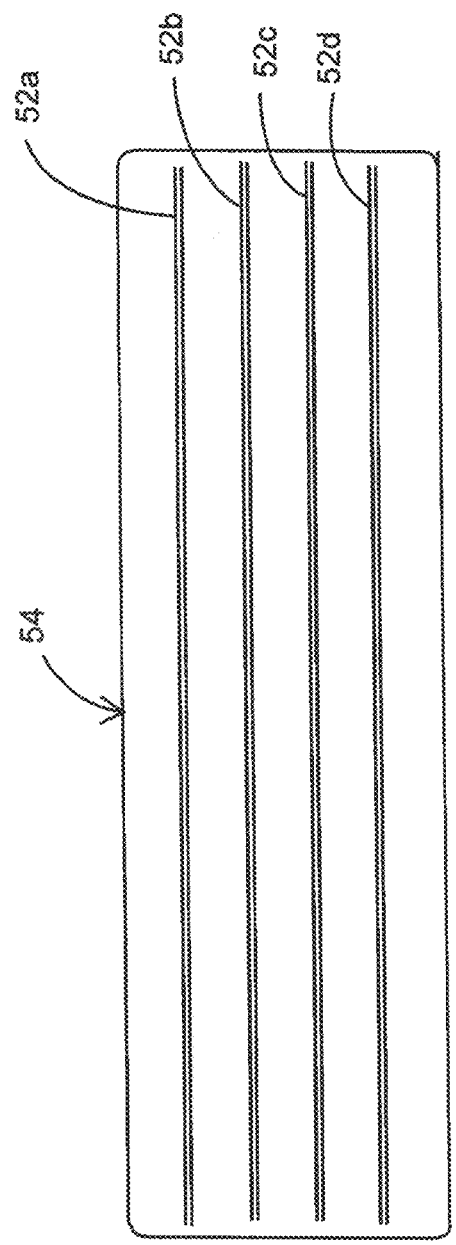
FIG. 1D is a schematic representation of a top view of the block in which the slots are formed.
Figure 1E:
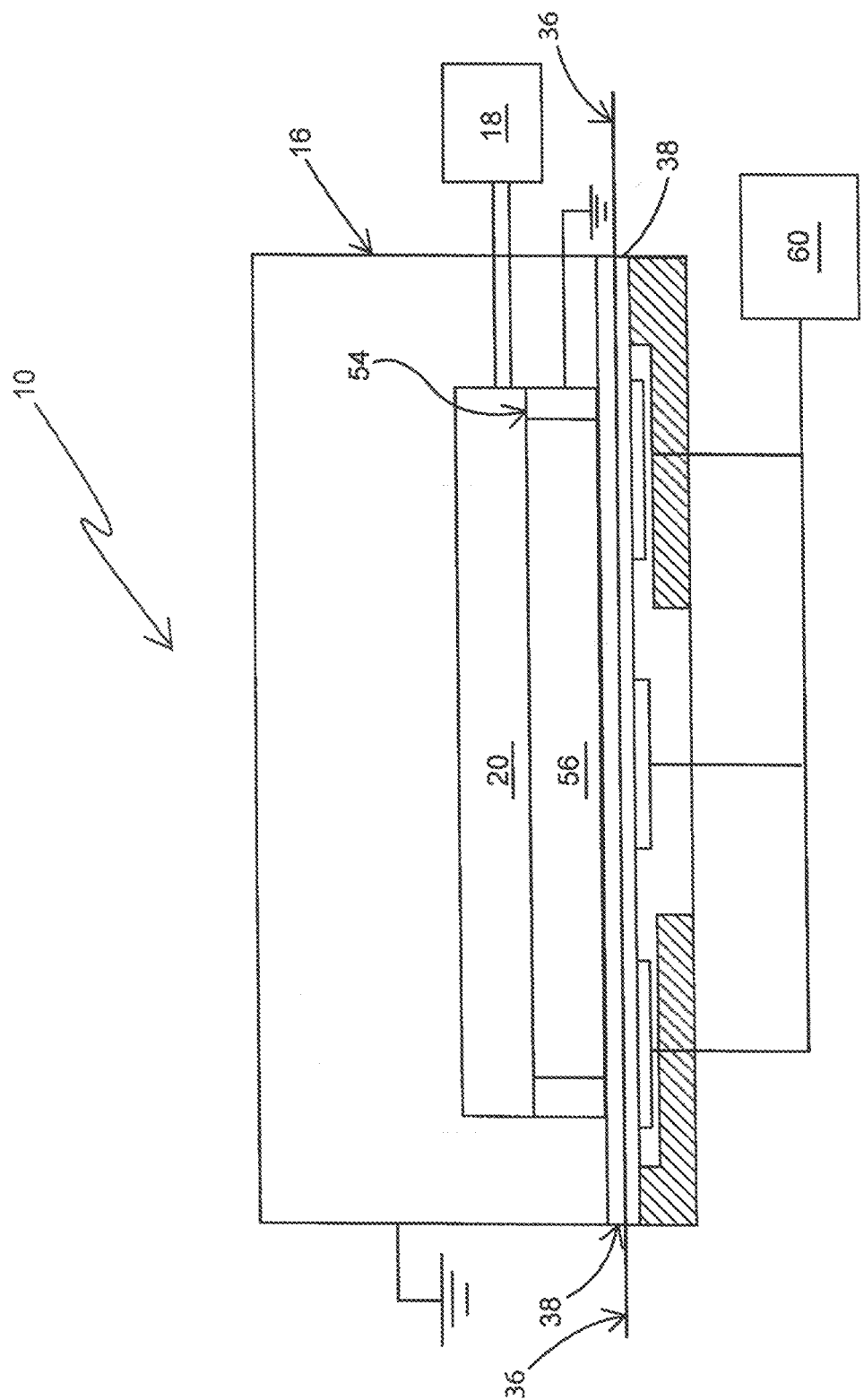
FIG. 1E is a schematic representation of a side view of still another embodiment of the plasma gas flow system, illustrating plasma gas from the gas source entering the plenum, and flowing into the plasma region through a fritted or porous metal insert having a chosen thickness and fitted into a grounded block.

FIG. 1C is a schematic representation of a side view of another embodiment of the plasma gas flow system for apparatus 10. Shown is plasma gas from source 18 entering plenum 20, and flowing into plasma region 38 through narrow elongated (into the page) slots, 52a-52d, having chosen widths, formed through grounded block, 54. To maintain uniform pressure, the cross-sectional area of plenum 20 is chosen to be greater than the twice the total area of slot openings. A plate with perforations having a chosen size could also be used (as shown in FIG. 1E). FIG. 1D is a schematic representation of a top view of block 54 in which slots 52a-52d are formed. Plenum pressures between about 40 psi and about 70 psi generate flows between about 1200 and about 1500 L/min. through each 2-mm slot at 50% porosity, or between about 6700 L/m$^2$-s and about 8400 L/m$^2$-s of plasma gas, respectively. It is anticipated that argon gas flow can be lowered to approximately 500 L/min. in embodiments of the present invention.

Figure 1F:
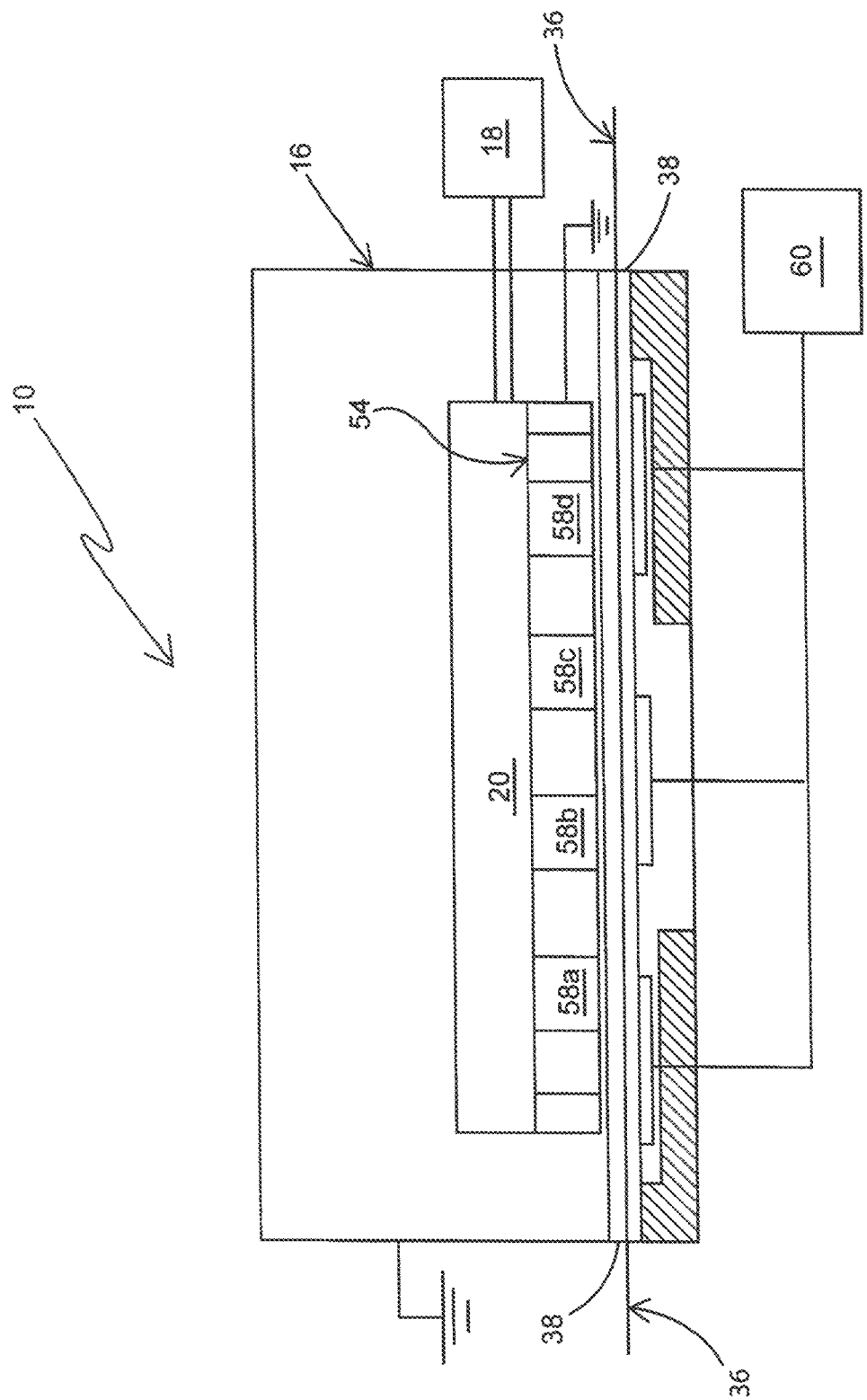
FIG. 1F is a schematic representation of a side view of another embodiment of the porous metal insert embodiment of the plasma gas flow system for the present apparatus, where multiple porous metal inserts having chosen thicknesses, and shapes, circular or rectangular, as examples, are placed in the grounded block in a selected pattern such that plasma gas can flow therethrough from the plenum into the plasma region.

FIG. 1E is a schematic representation of a side view of yet another embodiment of the plasma gas flow system for apparatus 10, illustrating plasma gas from source 18 entering plenum 20, and flowing into plasma region 38 through a fritted or porous metal insert, 56, having a chosen thickness and fitted into grounded block 16. Porous metal plates are typically made by sintering powders of stainless steel, Hastalloy, or Inconel. Titanium and Nickel powders may also be used. Microperforation is another process for manufacturing a porous plate. Typical pore sizes are 0.1-100 μm, with plates having open areas between about 10% and 70% of their total area. Porous metal generates uniform, laminar flow and pressure determines the flow rate. Thus, expensive mass flow controllers are not required. FIG. 1F is a schematic representation of a side view of another embodiment of the porous metal insert embodiment of the plasma gas flow system for apparatus 10. Multiple porous metal inserts, 58a-58c, having chosen thicknesses, and shapes, circular or rectangular, as examples, are placed in grounded block 54 in a selected pattern such that plasma gas can flow therethrough from plenum 20 into plasma region 38.

Once flow of plasma gas into plasma region 38 is commenced, pulses from voltage source, 60 (Nanosecond Pulse Generator, SSPG-20X-HP1; Transient Plasma Systems), having nanosecond duration, initiates plasma formation in plasma region 38. Pulsed voltage source 60 is shown as powering electrodes 28a-28c to simplify the FIGURES. As shown in FIG. 1C, separately triggered power supplies, 60a-60c, may be used to power the three electrodes.

Once conditions have been optimized for a particular substrate and chemistry, for example, the plasma gas flow and composition, power supply voltages, and the like, the product of the spacing between the grounded electrodes 14a-14e, and the dielectric plate 32, electrode lengths for electrodes 28a-28c (typically, 66 in. (148.5 cm)), and the widths of electrodes 28a-28c, which equals the plasma volume for each powered electrode, may be kept constant if it is desirable to vary the width of the electrodes or the distance between the grounded electrodes and the dielectric plate. Similarly, for a chosen electrode length, substrate, chemistry, and distance between the grounded electrode(s) (as discussed above, the grounded electrode could be a single electrode) and the dielectric plate, etc. one might optimize treatment by varying the number of powered electrodes activated by a single pulsed power supply as follows. An embodiment of the present invention may employ 1 in. wide powered electrodes having a 1 in. (2.54 cm) dielectric gap therebetween with a single 725 W pulsed power supply per electrode. If the powered electrode widths were reduced to 0.5 in. (1.27 cm) and the dielectric gap between them reduced to 0.5 in. (1.27 cm), a single 725 W pulsed power might be used to power two powered electrodes. Moreover, if the width of the powered electrodes were reduced to 0.3 in. (0.76 cm), and the dielectric gap or spacing between them were 0.3 in. (0.76 cm), a single 725 W pulsed power supply might be used to power three powered electrodes.

Pulse widths expressed as full-width at half-maximum (FWHM) employed ranged between about 10 ns and about 15 ns, with about 10 ns (to 90% voltage) "rise time". It is anticipated that pulse widths between about 10 ns and approximately 100 ns will be useful. Pulse frequency ranged between about 1 kHz and about 10 kHz, with the duty cycle of 15-ns pulses at 10 kHz being about 0.015% duty cycle, with a minimum duty cycle of approximately 0.0075% with about 5 kHz, 15 ns pulses. The voltages for a 2 mm gap 38 (grounded electrode to dielectric plate) ranged from about 8 kV to about 20 kV. As the gap was increased, the voltage was increased to about 30 kV.

The substrate may be treated with a chosen composition, which may react in the presence of the species generated in the plasma and, as will be discussed below, a monomeric species may be polymerized and caused to adhere to the substrate by such species.

Figure 2A:
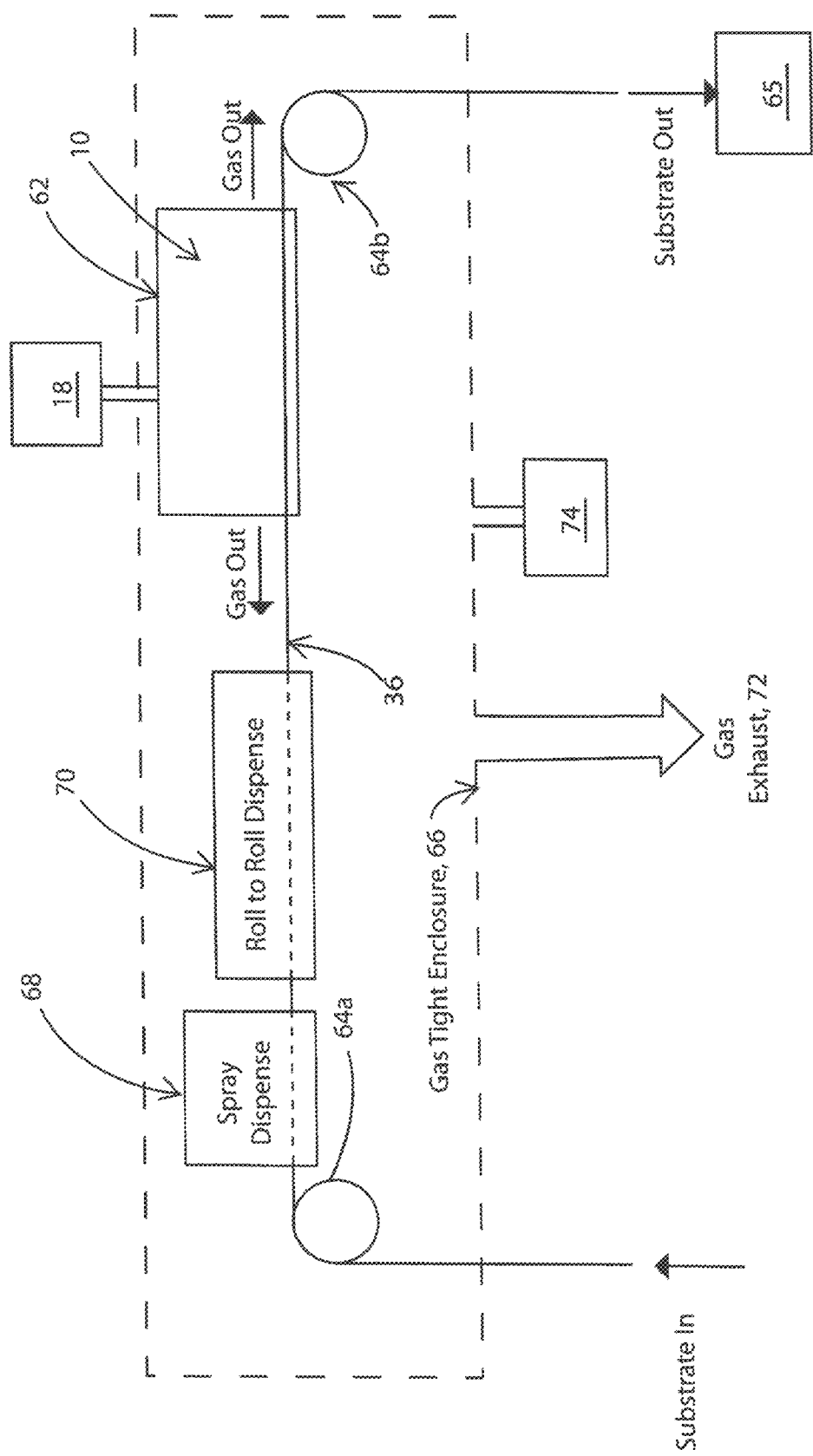
FIG. 2A illustrates the separation of the present plasma processing apparatus from monomeric material spray apparatus, or roll-to-roll dispense apparatus, using enclosures.

FIG. 2A illustrates plasma processing apparatus 10, having positive pressure enclosure, 62, through which substrate 36 passes over rollers, 64a and 64b, driven by apparatus, 65, hereinafter interpreted as means for moving the material through the plasma region at a chosen rate. As discussed above, plasma gas enters from source 18, and exits from the plasma regions into gas-tight enclosure, 66. Monomeric material spray apparatus, 68, which may comprise spray inkjet technology, or roll-to-roll dispense apparatus, 70, either of which may have a vapor capture system, may also introduce gases into enclosure 66, are physically separated from plasma processing apparatus 10. Gas-tight enclosure 66 surrounds plasma processing apparatus 10 and fabric pretreatment apparatus 68 or 70, with exhaust, 72, for venting plasma gases, and purging gases, such as nitrogen, if employed (for example, from nitrogen gas source, 74) for preventing air (oxygen and water vapor) from entering enclosure 66. The inert gas may be directed at an angle to the flow of substrate (fabric) 36 to assist in driving air out of the enclosure. Other means of treating substrate 36 with materials to be plasma treated in apparatus 10 may be employed. Keeping the fabric pretreatment materials away from the plasma prevents unwanted chemistry from taking place, with the consequential requirement of frequent cleaning of the electrodes.

Figure 2B:
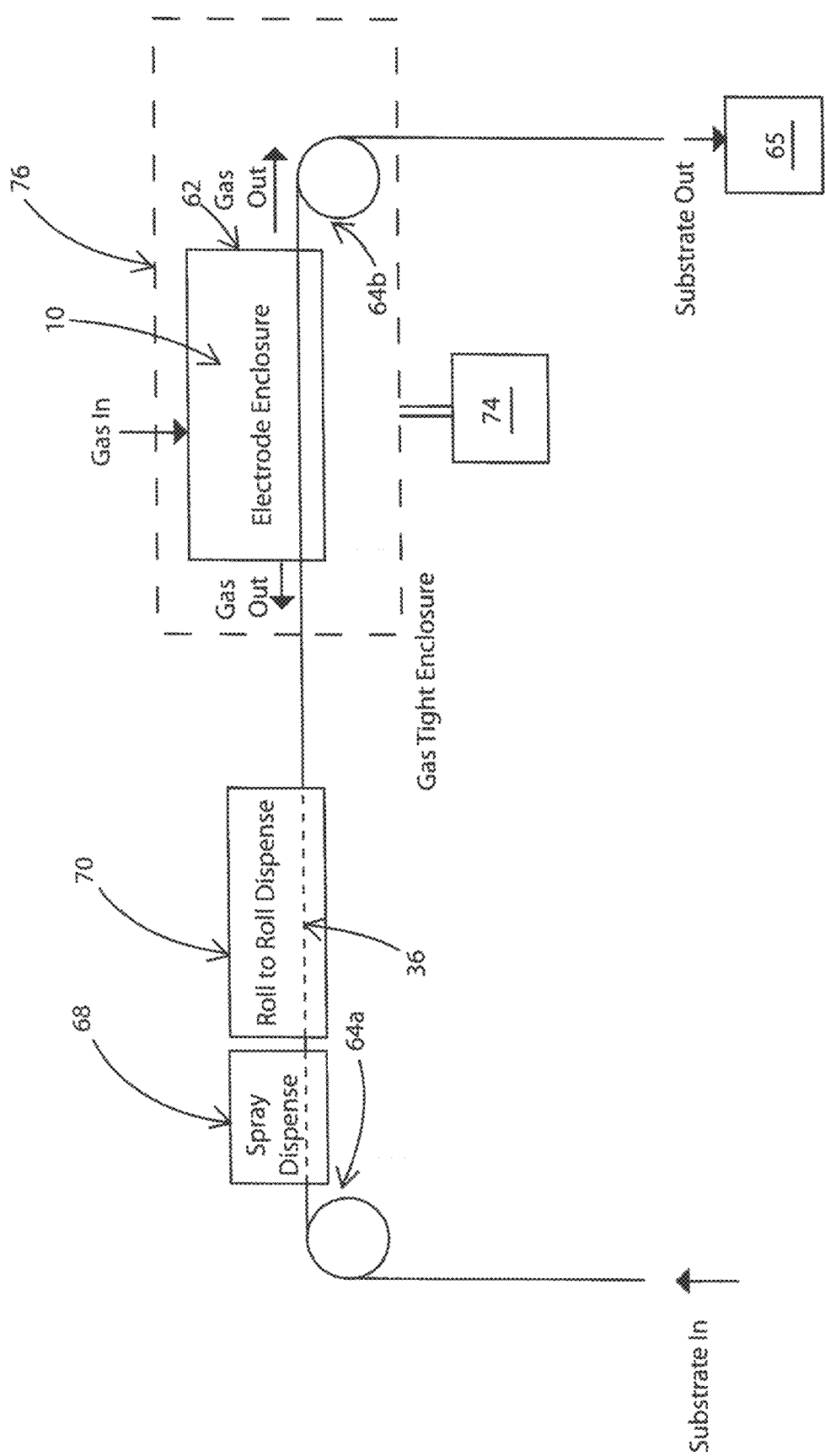
FIG. 2B illustrates another apparatus for separating the material spray apparatus and/or roll-to-roll dispense apparatus by enclosing the present plasma processing apparatus in a first positive pressure enclosure and then in a second positive pressure enclosure such that plasma gases and nitrogen purging exiting the second enclosure prevent the monomeric or other treatment materials from entering the plasma.

FIG. 2B illustrates another apparatus for separating the material spray apparatus and/or the roll-to-roll dispense apparatus by enclosing plasma processing apparatus 10 in first positive-pressure enclosure, 62, disposed in second positive-pressure enclosure, 76, such that plasma gases and nitrogen purging gas from gas source 74, exit enclosure 76, thereby preventing the monomeric, or other treatment materials, from entering the plasma region. Apparatus 65 draws the fabric over rollers 64a and 64b.

Having generally described the invention, the following EXAMPLES provides additional details.

EXAMPLES

Using 1H,1H,2H,2H-Perfluorooctyl Acrylate ($C_{11}H_7F_{13}O_2$) applied to a warp knit or rip stop polyester fabric by an ultrasonic spray, as a water repellant, TABLE 1 illustrates the fabric water repellency after zero, three and 10 launderings.

TABLE 1

REPELLENCY RESULTS NANOPULSE, ARGON AND HELIUM

| Fabric | Material | Construction | Fabric Weight (g/m2) | Plasma Gas | Repellency Initial (0 Launderings) | | | 3X Launderings | | | 10X Launderings | | |
|---|---|---|---|---|---|---|---|---|---|---|---|---|---|
| | | | | | OPP | Center | NOPP | OPP | Center | NOPP | OPP | Center | NOPP |
| Automotive | Polyester | Warp Knit | 100 | Helium | 95 | 95 | 95 | 80 | 80 | 80 | 80 | 80 | 80 |
| Automotive | Polyester | Warp Knit | 100 | Argon | 90 | 90 | 85 | 85 | 85 | 85 | 85 | 85 | 85 |
| Sheer Rip Stop | Polyester | Rip Stop | 65 | Helium | 100 | 100 | 100 | 80 | 90 | 80 | 75 | 75 | 75 |
| Sheer Rip Stop | Polyester | Rip Stop | 65 | Argon | 100 | 100 | 100 | 90 | 90 | 90 | 80 | 80 | 80 |

Gas flows of argon and helium, for comparison, were about 5500 L/min. The 62 in. (157.5 cm) wide fabric was run through the system at 13.7 yards/min. past electrodes having 66 in. (167.6 cm) length. The fabrics were dyed by conventional means, and there was no pre- or post-treatment. Three pulsed power supplies, synchronized to avoid arcing between the powered electrodes, were used, each being set to 725 W average power, in the apparatus described in FIGS. 1A and 1B adapted for use with three powered electrodes and three pulsed power supplies. Repellency numbers reflect AATCC #122 procedures, and 100=perfect repellency. Note that 'Opp'=operator side; and 'NOPP'=non-operator side. Typical passing grades are 70 after 10 launderings.

Clearly, it is to be observed from TABLE 1 that the repellency of the treated fabric is similar for an argon plasma to that for a helium plasma.

Figure 3A:
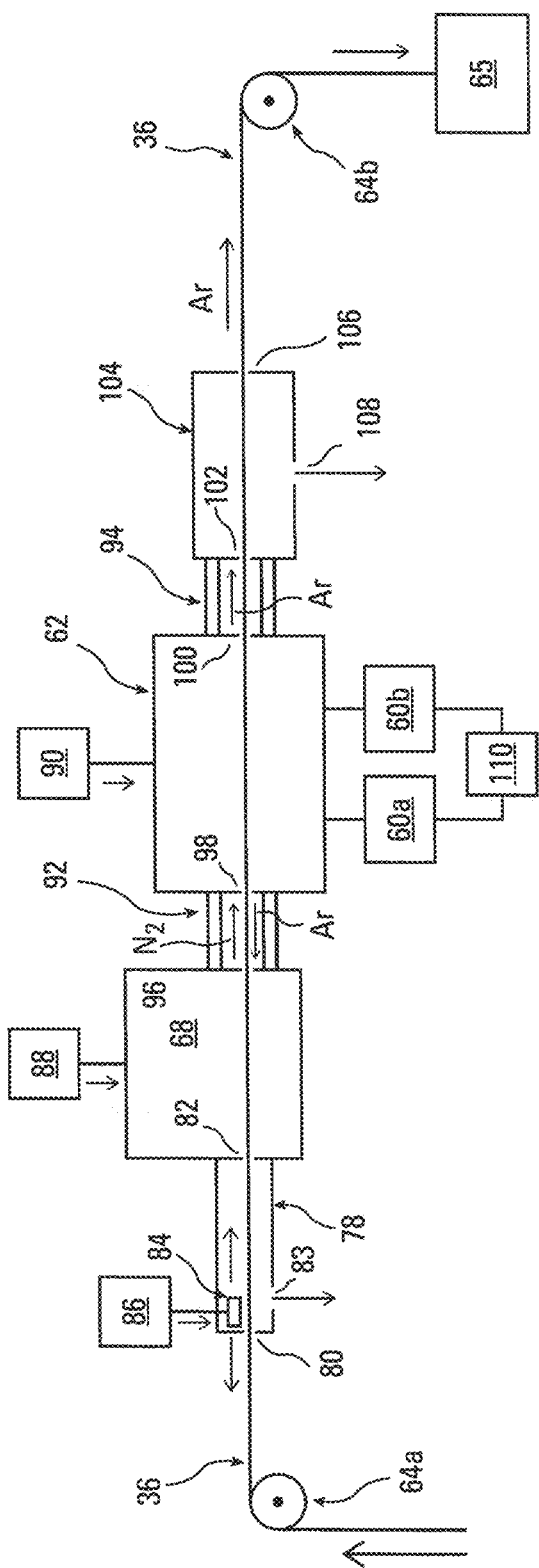
FIG. 3A is a schematic representation of the gas management system for an embodiment of the present invention where inert gases are flowed over and/or through the fabric to reduce entrainment of air as the fabric or substrate enters the processing system.

B. 50-120 m/min Fabric Speed:

Treatment of materials using embodiments of the present apparatus and method in a commercial environment requires fabric processing speeds in excess of 100 m/s. At such speeds, it has been found by the present inventors that air is entrained in the fabric or material as it passes through the apparatus, both during the coating process and the plasma process. FIG. 3A is a schematic representation of the gas management system for an embodiment of the present invention where inert gases are flowed over and/or through the fabric to reduce entrainment of air as the fabric or substrate enters the processing apparatus. Shown are gas tight entrance chamber or enclosure, 78, having opening, 80, for admitting fabric 36 to chamber 78 and for permitting gas to be exhausted past the incoming substrate 36, and exit, 82, for fabric 36, which opens into chemical dispense chamber 68. Nitrogen may also exit through opening, 83, from where it may be captured for recycling (Apparatus not shown in FIG. 3A). Fabric opening 80 is typically between 1 and 2 cm in the vertical direction, and about 2 cm on either side of substrate 36. Similar, matching dimensions are provided for the fabric inlet and outlet of chamber 68. Nitrogen knife (Exair Corporation, Cincinnati, Ohio, as an example), 84, is located inside of chamber 78 in the vicinity of the surface of substrate 36. Gas source, 86, provides 20-100 psi nitrogen to nitrogen knife 84 permitting high-velocity nitrogen (15-60 m/s) to be directed across or through the surface of substrate or fabric 36, with the objective of removing oxygen from the surface and bulk of substrate 36.

Inert gas, advantageously nitrogen, supplied by inert gas source, 88, is introduced into gas-tight chemical dispense chamber 68 for maintaining a positive pressure relative to ambient pressure for establishing an oxygen-free environment, and for preventing ambient contaminants from entering chamber 68.

Plasma chamber 62, which houses plasma processing apparatus 10 of the present invention is pressurized with argon or other plasma gases from gas source, 90, such that positive pressure is maintained from this chamber in the gas-tight entrance, 92, and exit, 94, wings thereof, through which substrate 36 moves, and through which gases may flow. Wing 92 acts as a gas buffer between chemical dispense chamber 68 and plasma processing chamber 62, where gases are balanced to prevent nitrogen and chemical vapors from entering chamber 62. Similarly, argon is prevented from entering chamber 68. Typical dimensions for the fabric opening of entrance, 96, of wing 92 and that for the fabric opening exit, 98, thereof, and for the fabric opening of entrance, 100, of wing 94 and that for the fabric opening exit, 102, thereof are between 1 and 2 cm in the vertical direction, and about 2 cm on either side of substrate 36. Similar, matching dimensions are provided for the fabric inlet and outlet of chamber 62.

Plasma gas is directed through exit wing 94 to post treatment chamber, 104, where a higher pressure in wing 94 is maintained than in chamber 104. Typical dimensions for the fabric entrance opening of post treatment chamber 104 are between 1 and 2 cm in the vertical direction, and about 2 cm on either side of substrate 36 to match those for the fabric opening exit 102 of wing 94, and similar to those of the fabric exit, 106, of post treatment chamber 104. Thus, post treatment chamber 104 will maintain an argon environment, and may include UV or IR lamps to irradiate the processed substrate, as an example of post treatment. Exhaust gases may exit chamber 104 in the direction of substrate 36, and/or through another exit orifice, 108, where it may be collected for recycling (Apparatus not shown in FIG. 3A).

All chambers are connected using gas-tight seals, effectively forming a contiguous chamber. Shown also in FIG. 3A are nanopulse power supplies 60a and 60b (Nanopulsers 1 and 2) supplying power to the electrodes in plasma processing chamber 62, connected by phase delay trigger, 110. In the following discussion, wings 92 and 94 were attached to plasma processing chamber 62 without benefit from the contiguous enclosures to the chemical dispense chamber 68 and the post-treatment chamber 104. Moreover, nitrogen knife 84 has not yet been tested in the present apparatus.

Figure 3B:
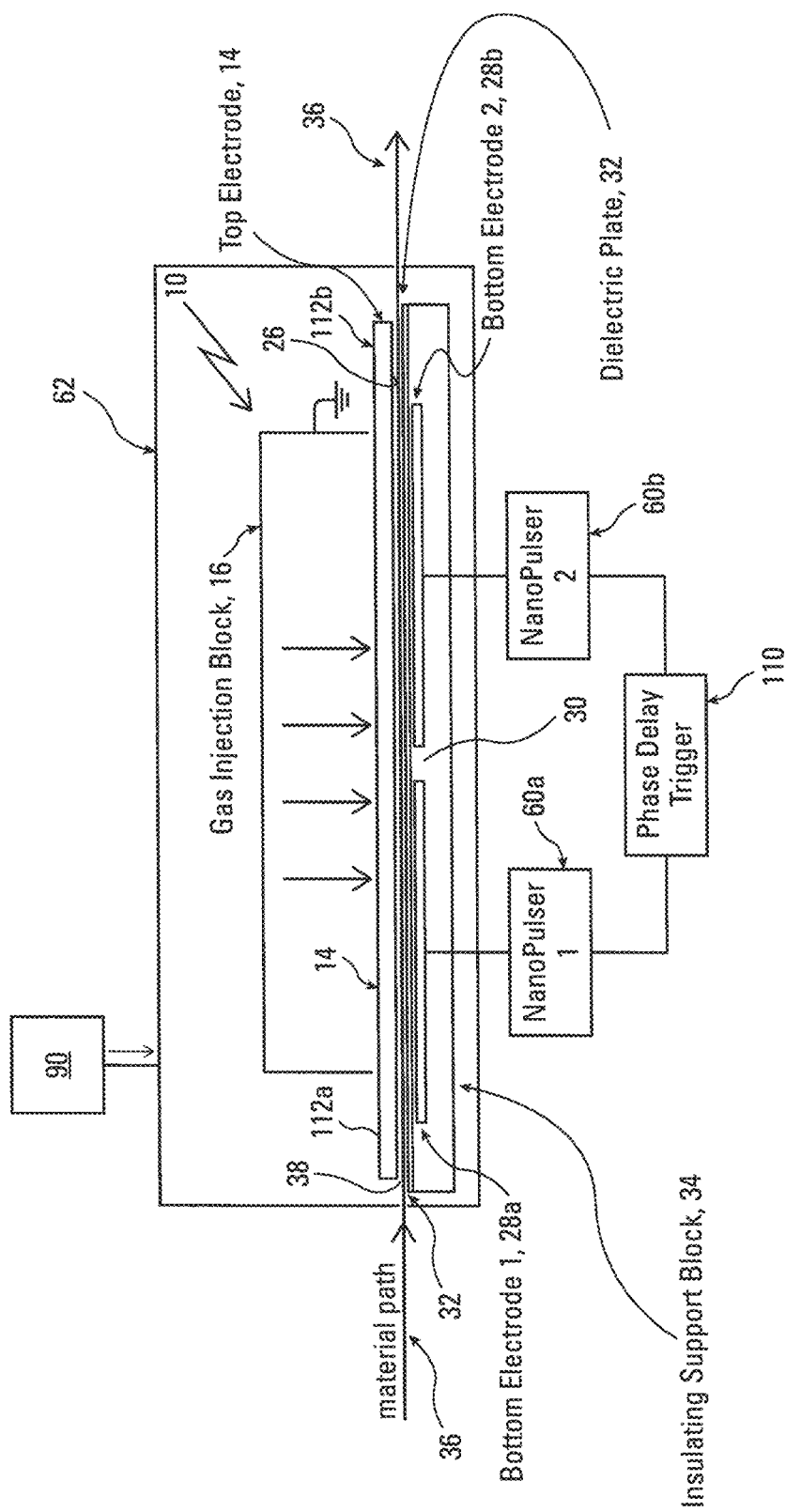
FIG. 3B is a schematic representation of an higher fabric speed embodiment of the plasma apparatus of the present invention, illustrating two planar, spaced-apart powered metal bottom electrodes disposed in depressions in an insulating support block and parallel to the bottom surface of planar grounded metal top electrode and covered by a dielectric plate, the spacing being formed from the material of the insulating block between the depressions, wherein the grounded top electrode overlaps or extends beyond the powered electrodes by a chosen amount in the direction of the substrate for increasing the dwell time of the substrate in the plasma.

At higher material or substrate feed speeds, it is necessary to consider the dwell time of the substrate in the plasma to effectuate adequate curing. Therefore, the plasma electrodes have been modified to achieve this goal. The apparatus illustrated in FIG. 1A did not provide adequate dwell time for significant cure at higher speeds. FIG. 3B is a schematic representation of another embodiment of the plasma apparatus of the present invention. Shown are two planar, spaced-apart (30) powered metal bottom electrodes 28a and 28b disposed in depressions in insulating support block 34, and parallel to bottom surface 26 of planar grounded metal top electrode 14, and covered by dielectric plate 32. Spacing 30 is formed from the material of insulating block 34 between the depressions. Grounded top electrode 14 overlaps or extends, 112a, 112b, beyond powered electrodes 28a, 28b by 2.54 cm, in the direction of substrate 36, as this was found to increase the dwell time by extending the plasma field beyond the powered electrodes. Other overlap lengths are anticipated to be advantageous depending on the rate of movement of the substrate through the plasma volume, as an example. Materials employed in the apparatus of FIG. 3B are described above in the descriptions for FIGS. 1A and 1B.

Each powered electrode 28a, 28b is powered individually by pulsed power supplies or nanopulsers 60a and 60b, respectively. Pulsed power supplies 60a and 60b are triggered by a fiber optic signal from Phase Delay Trigger 110 at a rate of between 0 kHz and 10 kHz. Each pulse from each nanopulser must be delayed or offset from the others to avoid interference between pulsers or arcing between electrodes. This is performed by delaying each pulser by a given number of microseconds. In one embodiment, each pulser is phase delayed by 20 μs, with each pulser running at 10 kHz.

TABLE 2 shows the cure results in units of grams per square meter (gsm) as related to power density and dwell or residence time for the high fabric speed embodiment of apparatus 10 illustrated in FIGS. 3A and 3B, for various electrode lengths and widths. Note that the powered electrodes are separated by 5.1 cm of dielectric material. The coating chemistry is described in the EXAMPLES above for a polyester film substrate passed through the apparatus at 60 m/min. The Ar flow rate was 5500 L/min.

To be observed from TABLE 2:

1. The 10" (25.4 cm) wide electrode provides twice the power density over that for the 20" wide electrode, thereby improving performance for the same dwell time;
2. For greater than 18" (45.7 cm) lengths, the 10" (25.4 cm) wide electrode does not have sufficient power density to sustain an increase in dwell time;
3. At the same power density, twice the dwell time generates twice the cure; and
4. The maximum cure of 0.8 gsm is seen for a 10" (25.4 cm) wide and 18" (45.7 cm) long electrode at a power density of 6.2 kWatts/m².

TABLE 2

CURE RELATIONSHIP TO POWER DENSITY AND RESIDENCE TIME

| Bottom Electrode | | Residence Time | Power Density | Cure |
|---|---|---|---|---|
| Width (m) | Length (m) | (s) | (kW/m2) | (gsm) |
| 0.25 | 0.51 | 0.55 | 5.55 | 0.70 |
| 0.25 | 0.46 | 0.50 | 6.15 | 0.80 |
| 0.25 | 0.41 | 0.44 | 6.93 | 0.70 |
| 0.25 | 0.36 | 0.39 | 7.92 | 0.73 |
| 0.25 | 0.30 | 0.33 | 9.24 | 0.64 |
| 0.25 | 0.25 | 0.28 | 11.08 | 0.57 |
| 0.51 | 0.51 | 0.55 | — | |
| 0.51 | 0.46 | 0.50 | — | |
| 0.51 | 0.41 | 0.44 | 3.46 | 0.52 |
| 0.51 | 0.36 | 0.39 | 3.95 | 0.52 |
| 0.51 | 0.30 | 0.33 | 4.62 | 0.34 |
| 0.51 | 0.25 | 0.28 | 5.55 | 0.24 |

The above observations suggest that higher residence times provide greater cure results, and that higher power densities produce better results for a given residence time. Note that as the residence time increases, the power density decreases. It is expected that for some increased residence time, there will be diminished cure as a result of lower power density.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An atmospheric-pressure plasma apparatus for processing a material, comprising: at least one grounded electrically conducting electrode having at least one planar surface having a chosen length and width, and a chosen height; at least one powered conducting electrode having at least one planar surface having a chosen length and width, overlapping, spaced apart a selected distance from, and parallel to said at least one grounded electrically conducting electrode; a dielectric flat plate in physical contact with the at least one planar surface of said at least one powered conducting electrode between said at least one powered conducting electrode and said at least one grounded electrically conducting electrode, said dielectric flat plate having an elongated flat surface facing the at least one planar surface of said at least one grounded electrically conducting electrode for electrically shielding the at least one planar surface of said at least one powered conducting electrode from the at least one planar surface of said at least one grounded electrically conducting electrode, and forming a plasma region between the at least one planar surface of said at least one grounded electrically conducting electrode and the elongated flat surface of said dielectric flat plate; at least one pulsed power supply, one of said at least one pulsed power supply in electrical communication with at least one of said at least one powered conducting electrode, for providing nanosecond duration high-voltage pulses thereto; a source of plasma gas, wherein said plasma gas comprises argon in the absence of helium; a gas manifold for receiving plasma gas from said source of plasma gas; at least one elongated gas injection block in contact with at least one of said at least one grounded electrically conducting electrode, and having an elongated chamber in fluid communication with the plasma region; a porous tube disposed within the chamber of each of said at least one elongated gas injection block for receiving plasma gas from said gas manifold, and uniformly flowing said plasma gas through the plasma region; whereby a plasma is formed in the plasma region responsive to nanosecond duration high-voltage pulses from said at least one pulsed power supply, and said material is located in the plasma region.

2. The atmospheric-pressure plasma apparatus of claim 1, further comprising a source of coolant having a chosen temperature for cooling said at least one grounded electrically conducting electrode.

3. The atmospheric-pressure plasma apparatus of claim 1, wherein said plasma gas comprises argon and a gas chosen from nitrogen, hydrogen, and oxygen, and mixtures thereof.

4. The atmospheric-pressure plasma apparatus of claim 1, further comprising means for moving said material through the plasma region at a chosen rate.

5. The atmospheric-pressure plasma apparatus of claim 1, wherein said dielectric flat plate comprises materials chosen from glass, PETG, (Polyethylene Terephthalate, Glycol-modified), and ceramic.

6. The atmospheric-pressure plasma apparatus of claim 5, wherein said dielectric flat plate comprises glass between about 1/16 in. and about 1/4 in. in thickness.

7. The atmospheric-pressure plasma apparatus of claim 1, further comprising an electrically insulating support plate for said at least one powered conducting electrode.

8. The atmospheric-pressure plasma apparatus of claim 7, wherein said support plate comprises polycarbonate.

9. The atmospheric-pressure plasma apparatus of claim 1, wherein the at least one planar surface of said at least one grounded electrically conducting electrode and the planar surface of said dielectric flat plate are spaced apart between about 1 mm and about 8 mm.

10. The atmospheric-pressure plasma apparatus of claim 1, wherein the full-width at half-maximum of the nanosecond pulses is between about 10 ns and about 100 ns.

11. The atmospheric-pressure plasma apparatus of claim 10, wherein the rise time of the nanosecond pulses is about 10 ns.

12. The atmospheric-pressure plasma apparatus of claim 1, wherein at least one pulsed power supply comprises a plurality of pulsed power supplies and each of said at least one pulsed power supply has a chosen phase delay from another of said at least one power supply.

13. The atmospheric-pressure plasma apparatus of claim 1, wherein the chosen length of said at least one grounded electrically conducting electrode is larger by a selected amount than the chosen length of said at least one powered conducting electrode.

14. The atmospheric-pressure plasma apparatus of claim 1, further comprising a gas-tight enclosure adapted for excluding other than plasma gas from the plasma region.

* * * * *